United States Patent
Merrill

[11] Patent Number: 6,137,374
[45] Date of Patent: Oct. 24, 2000

[54] LOW POWER CLOCK OSCILLATOR

[75] Inventor: Brian R. Merrill, Waterford, Mich.

[73] Assignee: Chrysler Corporation, Auburn Hills, Mich.

[21] Appl. No.: 09/173,437

[22] Filed: Oct. 15, 1998

[51] Int. Cl.$^7$ .................................................. H03B 5/02
[52] U.S. Cl. ...................... 331/158; 331/74; 331/116 FE; 331/185; 331/160
[58] Field of Search .......................... 331/116 FS, 158, 331/185, 74, 116 R, 160

[56] References Cited

U.S. PATENT DOCUMENTS

| | | | |
|---|---|---|---|
| 4,064,468 | 12/1977 | Kumata | 331/116 R |
| 4,591,807 | 5/1986 | Davis | 331/116 R |
| 4,618,837 | 10/1986 | Matsuura | 331/160 |
| 4,896,122 | 1/1990 | Tahernia et al. | 331/158 |
| 4,990,847 | 2/1991 | Ishimaru et al. | 323/314 |
| 5,126,695 | 6/1992 | Abe | 331/146 |
| 5,155,453 | 10/1992 | Ruetz | 331/116 FE |
| 5,184,094 | 2/1993 | Kohler | 331/158 |
| 5,208,558 | 5/1993 | Shigehara et al. | 331/116 FE |
| 5,220,291 | 6/1993 | Hagadorn | 331/108 A |
| 5,325,074 | 6/1994 | Suenaga | 331/46 |
| 5,331,296 | 7/1994 | Davis | 331/158 |
| 5,483,205 | 1/1996 | Kawamura | 331/74 |
| 5,486,795 | 1/1996 | Spence et al. | 331/116 FE |
| 5,552,751 | 9/1996 | Cooper | 331/116 FE |
| 5,557,243 | 9/1996 | Ho | 331/158 |
| 5,719,534 | 2/1998 | Imura | 331/18 B |
| 5,757,242 | 5/1998 | Chow et al. | 331/57 |

*Primary Examiner*—Arnold Kinkead
*Attorney, Agent, or Firm*—Roland A. Fuller, III

[57] ABSTRACT

A low power clock oscillator circuit for driving microprocessors and other digital circuits is provided. The clock oscillator includes a resonant network for providing a sinusoidal waveform at a predetermined frequency. A first amplifier for amplifying the sinusoidal input waveform provides an output to a second amplifier. The second amplifier converts the amplified sinusoidal waveform to a continuous pulse output having a level-shifted voltage level greater than the amplitude of the sinusoidal waveform. The first amplifier is powered from a power source having a voltage level that is less than the power source that powers the second amplifier. Additionally, the second amplifier includes an enable input for disabling the continuous pulse output to permit decreased power operation with fast restart capability.

9 Claims, 1 Drawing Sheet

LOW POWER CLOCK OSCILLATOR

BACKGROUND OF THE INVENTION

1. Field of the Invention

The present invention relates generally to oscillator circuits for providing a waveform of a predetermined frequency. More particularly, the invention relates to an oscillator circuit that minimizes input power requirements having a continuous pulse output.

2. Discussion

With the current growth in electrical and electronic technology, there is a growing interest in broadening the maintenance and service functions of various systems. One of the more promising areas for increasing system monitoring capability is automotive ignition off systems.

Numerous functions in an automobile are monitored by on-vehicle systems when the ignition is off. Examples of such functions include, door ajar detection and alarm, remote keyless entry, local door lock/unlock, and anti-theft alarm systems. The availability of these functions provide consumers with enhanced convenience and comfort, however in return there is an increased risk that the vehicle battery will not retain sufficient energy to start the vehicle because of the ignition off draw (IOD) required to power the monitor circuits. Due to the continuous power drawn from the battery there is a limited period of time that the vehicle can remain idle before the battery stored charge is depleted.

In general, IOD monitor circuits comprise sensors to acquire data, analog-to-digital conversion circuitry, microprocessors to manipulate the digital data, and oscillators to drive the microprocessors. In IOD monitor circuits the oscillator consumes a significant portion of the power that drives each circuit. Generally, an oscillator is comprised of a linear portion that generates a sinusoidal waveform at a predetermined frequency and a buffer amplifier that converts the sinusoidal signal to a square-wave output which is suitable for driving a microprocessor. The output drive stage of the linear portion of the oscillator consumes the majority of the power within the circuit. The drive stage is typically a push-pull Class AB amplifier configuration in which the current draw is directly related to the voltage applied. Powering the entire oscillator from the same voltage level results in significant power consumption within the linear stage of the circuit, thereby substantially reducing the period of time a vehicle may be left idle before the battery dies. While conventional oscillator circuit configurations can be used to drive microprocessors, they have not proven capable of providing a clock signal without substantial power consumption.

Therefore, it is desirable to reduce the IOD of automotive electrical circuits by reducing the power consumption of the oscillator circuits. Powering the linear portion of the oscillator circuit from a lower voltage level than the remainder of the circuit minimizes the circuit power consumption.

It is another object of the present invention to provide a fast start-up capability so that the oscillator can be maintained in a low-power sleep mode, thereby minimizing power consumption during periods of time when the particular monitor circuit is not required.

It is also another object of the present invention to use a common source voltage to power the oscillator and the remainder of the circuit. Employing a common voltage source minimizes the cost and complexity of the overall system.

Further, it is another object of the present invention to employ standard low-cost devices for the oscillator circuit.

SUMMARY OF THE INVENTION

To achieve the foregoing objectives, the present invention is an improved low power clock oscillator circuit. The oscillator includes a resonant network for providing a sinusoidal reference waveform of a predetermined frequency. The sinusoidal reference waveform is amplified by an oscillator amplifier which is powered from a voltage source. The amplified reference waveform is converted to a continuous pulse output and level-shifted by a level-shifter amplifier. The level-shifter is powered at a higher voltage level than the oscillator amplifier. The continuous pulse output waveform from the level-shifter is used to drive digital circuitry. In addition, an enable input may be added to the level-shifter amplifier to permit a further reduction in power consumption and enable fast-startup after a period of inactivity.

BRIEF DESCRIPTION OF THE DRAWINGS

Additional advantages and features of the present invention will become apparent to those skilled in the art upon reading the following detailed description and upon reference to the drawings in which.

DETAILED DESCRIPTION OF THE PREFERRED EMBODIMENTS

The following description of the preferred embodiment is merely exemplary in nature and is in no way intended to limit the invention or its application or uses.

Figure 1:
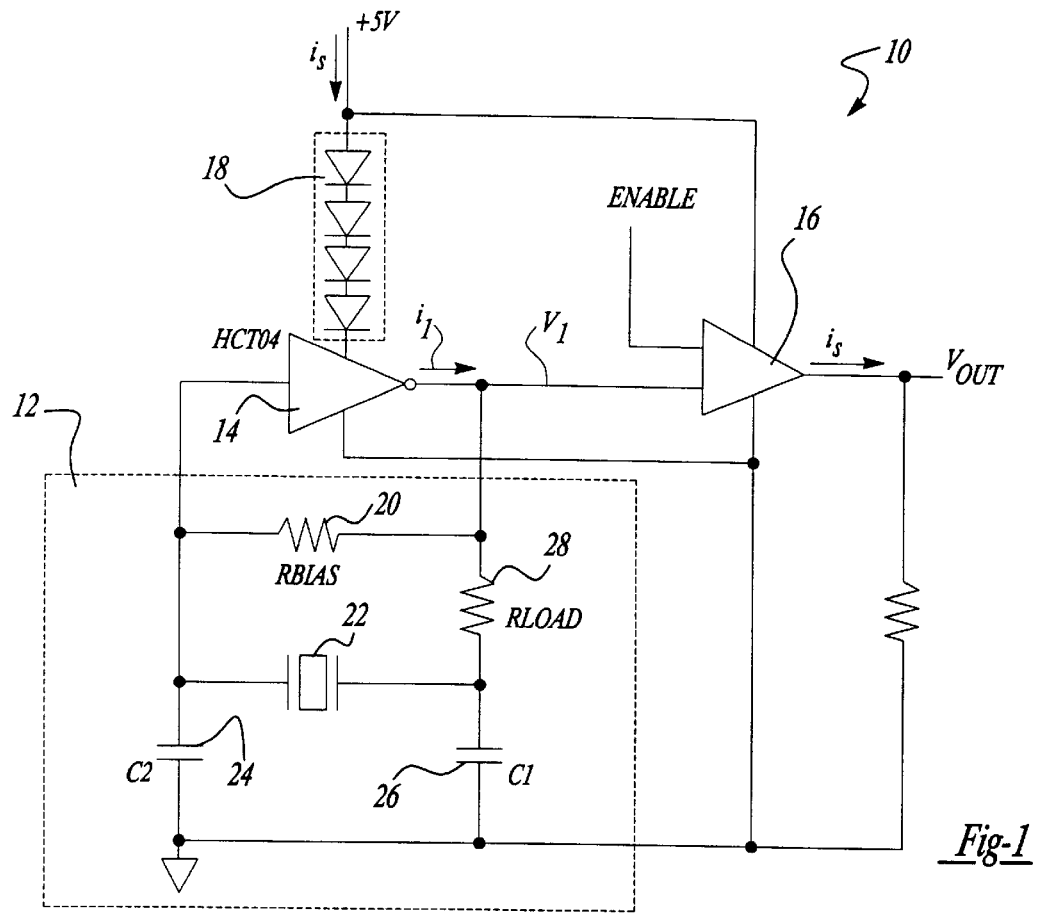
FIG. 1 is a schematic diagram of the showing a preferred embodiment of the invention.

Referring to FIG. 1, an exemplary low power clock oscillator is illustrated at 10. The present oscillator circuit 10 operates at a frequency of approximately 4 MHz, although both higher and lower clock frequencies are envisioned. Thus, oscillators operating from approximately 100 Hz to 100 MHz are possible with clock circuits provided in accordance with the present invention.

The clock oscillator circuit 10 comprises a resonant network 12, an oscillator amplifier 14, a level-shifter amplifier 16, and a voltage dropping circuit 18. The resonant network 12 provides an input waveform of a specified frequency from the output to the input of oscillator amplifier 14. The resonant network 12 of the present embodiment is a Colpitts configuration, however, the principles of the invention may be readily extended to other resonant network configurations such as Hartley and Pierce oscillators. The components that comprise resonant network 12 include a biasing resistor 20 connected from the input to the output of oscillator amplifier 14, a crystal 22 with associated capacitors 24 and 26, and a load resistor 28 coupled from the output of oscillator amplifier 14 to crystal 22.

The output of oscillator amplifier 14 connects to the input of level-shifter amplifier 16 which also receives an enable input. In the present embodiment CMOS devices are used for oscillator amplifier 14 and level-shifter amplifier 16, however other well known IC families are also envisioned, such as bipolar and FAST as well as custom IC implementations. Power to level-shifter amplifier 16 is provided directly from +5 volt source 30. Whereas, power to oscillator amplifier 14 is provided from +5 volt source 30 through a voltage dropping circuit 32 that comprises four series diodes. Although the voltage dropping circuit in the present embodiment is a string of diodes, it is within the scope of the invention to employ other devices, such as zener diodes, resistors in combination with a decoupling capacitor, and voltage regulators.

Figure 2:
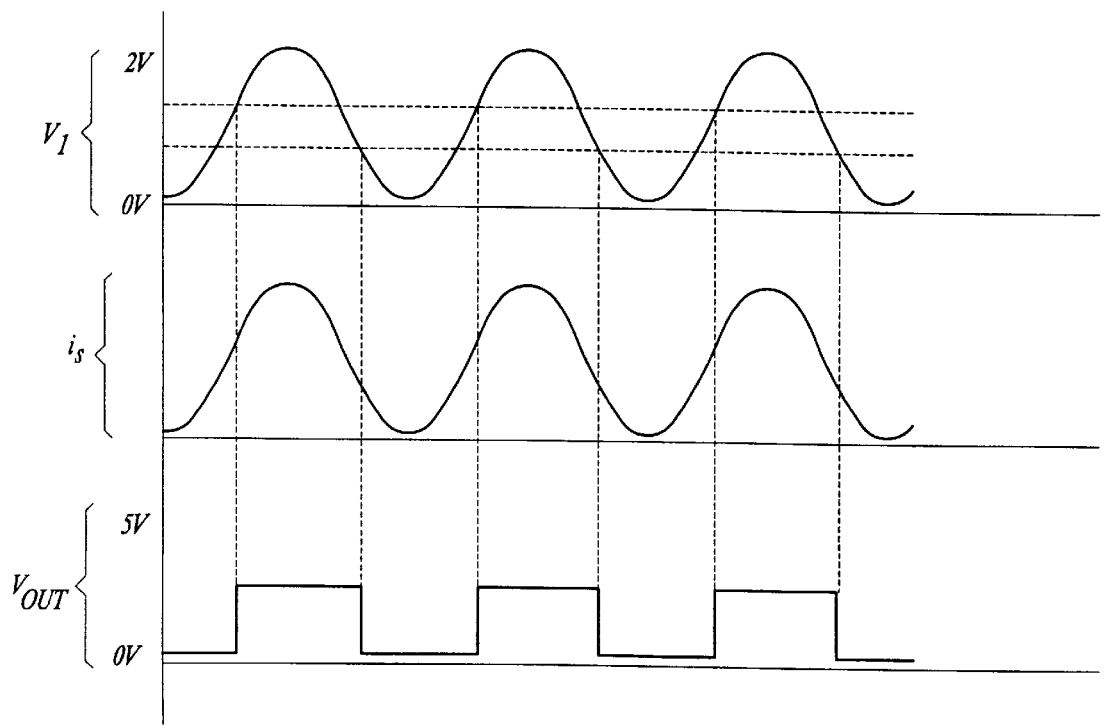
FIG. 2 is a signal diagram showing the current and voltage waveforms associated with the preferred embodiment of the invention.

Referring to FIGS. 1 and 2, the operation of the presently preferred embodiment is illustrated. During steady-state operation resonant network 12 supplies a sinusoidal input waveform of approximately 4 MHz to the input of oscillator amplifier 14. The input waveform is amplified by oscillator amplifier 14 and provided as a substantially sinusoidal input to level-shifter amplifier 16. In the present embodiment, the amplitude of the amplified waveform is less than 2 volts. The maximum amplitude of the amplified waveform is limited to the Vcc voltage minus the voltage drop of the output stage of oscillator amplifier 14. Decreasing the voltage level of oscillator amplifier 14 Vcc causes a commensurate decrease in the current flowing through the output stage, thereby decreasing the power consumption of the oscillator circuit 10. Although decreasing the voltage level of the oscillator amplifier 14 Vcc minimizes the power consumption of oscillator circuit 10, the resulting amplified waveform must be of sufficient amplitude relative to the input voltage threshold of level-shifter amplifier 16 to ensure reliable switching. Additionally, although in the present embodiment Vcc of oscillator amplifier 14 is limited to less than 3 volts, it is within the scope of the invention to limit oscillator amplifier 14 Vcc to voltages that range from minimally less than the level-shifter 16 Vcc, to voltage levels that are approximately equal to the input voltage threshold of level shifter 16. Level-shifter amplifier 16 converts the low voltage sinusoidal signal to a continuous pulse output having an amplitude of approximately 5 volts. In the present embodiment the duty cycle of the level-shifter amplifier output waveform is approximately 50%, however in other embodiments it may vary due to differences in the amplitude of the input waveform and the high and low input threshold voltages of different IC families. Additionally, although discrete devices are used in the present embodiment, it is envisioned that the clock oscillator circuit 10 may be implemented in a custom IC in which the bias circuitry is optimized for operation with multiple Vcc inputs.

The steady-state supply current, $i_s$, of clock oscillator circuit 10 is dominated by the current flowing through oscillator amplifier 14, with a negligible amount of current flowing into resonant network 12 and level-shifter amplifier 16. The majority of the current in oscillator amplifier 14 flows through the push-pull output stage which operates in the linear region. Although the invention embodies other output stage configurations such as class A and class B circuits, it is ideally suited for Class AB push-pull configurations. In a push-pull output stage the amplitude of the current is proportional to the amplitude of Vcc. Therefore, decreasing the amplitude of Vcc causes the current amplitude to decrease resulting in less power being drawn from the +5 volt source 30. In the present embodiment, decreasing Vcc of the oscillator amplifier 14 to approximately 2.6 volts results in a 50% decrease in supply current to oscillator circuit 10.

Again referring to FIG. 1, the operation of the enable input of level-shifter 16 is as follows. To further reduce power consumption of the oscillator circuit 10 the level-shifter amplifier 16 may be disabled by means of an enable input. When operation of the monitor circuit is not required the output of level-shifter amplifier 16 is set to the low state reducing the output stage current, thereby minimizing the power draw of the amplifier 16. The enable input has the further advantage of providing a fast restart capability for the oscillator circuit 10. At initial startup an oscillator circuit generally requires thousands of clock cycles before providing a stable output waveform as the voltage across the crystal gradually settles out to its steady-state level. Disabling the output of the second amplifier, but permitting the first amplifier to continue to function permits the voltage across the crystal to remain stable, thereby enabling the oscillator circuit to provide a stable waveform within a couple of cycles of restart.

From the foregoing it will be understood that the invention provides a circuit that is capable of reducing the IOD of automotive electrical circuits by reducing the power consumption of the oscillator circuits. Powering the linear portion of the oscillator circuit from a lower voltage level than the remainder of the circuit minimizes the circuit power consumption.

Additionally, the invention provides a fast start-up capability so that the oscillator can be maintained in a low-power sleep mode, thereby minimizing power consumption during periods of time when the particular monitor circuit is not required.

Also, the present invention encompasses circuits that use a common source voltage to power the oscillator and the remainder of the circuit. Employing a common voltage source minimizes the cost and complexity of the overall system.

Further, the present invention includes embodiments that employ standard low-cost devices for the oscillator circuit as well as custom IC implementations.

Although certain preferred embodiments of the invention have been herein described in order to afford an enlightened understanding of the invention, and to describe its principles, it should be understood that the present invention is susceptible to modification, variation, innovation and alteration without departing or deviating from the scope, fair meaning, and basic principles of the subjoined claims.

What is claimed is:

1. A low power clock oscillator circuit for reducing circuit power consumption comprising;
    a resonant network configured as a Colpitts oscillator for providing an input waveform of a specified frequency to the oscillator circuit;
    a first amplifier including an input coupled to the resonant network and an output coupled to the resonant network through a load resistor for producing a sinusoidal output having an oscillating frequency substantially equal to the input waveform frequency, said first amplifier having a supply terminal for receiving a supply voltage;
    a bias resistor coupled between the first amplifier input and the first amplifier output;
    a second amplifier having an enable input and a signal input connected to the output of the first amplifier for converting the first amplifier sinusoidal output to a continuous pulse output, said second amplifier having a single supply terminal for receiving a supply voltage, wherein the second amplifier supply voltage is greater than the supply voltage of the first amplifier;
    whereby powering the first amplifier from the lower supply voltage causes a reduction in supply current thereby reducing the power consumption of the clock oscillator circuit.

2. The low power clock oscillator circuit of claim 1 further comprising a voltage dropping device connected between a supply terminal of said first amplifier and a low voltage power supply for providing a decreased supply voltage to the first amplifier.

3. The low power clock oscillator circuit of claim 2 wherein the voltage dropping device is a diode.

4. The low power clock oscillator circuit of claim 1 wherein the first amplifier is a CMOS inverter gate.

5. The low power clock oscillator circuit of claim 1 wherein the second amplifier further comprises an enable input for disabling the continuous pulse output of said buffer amplifier thereby reducing power consumption of the oscillator circuit.

6. The low power clock oscillator circuit of claim 1 wherein the resonant network is a Colpitts configuration.

7. A method of minimizing power to a clock oscillator circuit, wherein said oscillator circuit includes a resonant network configured as a Colpitts oscillator for generating a sinusoidal input waveform, a first amplifier for amplifying the sinusoidal input waveform, a second amplifier for providing a continuous pulse output, and a power source having a voltage level for providing power to the oscillator circuit, the method comprising the steps of:

applying power from the power source to the oscillator circuit;

reducing the voltage level applied to the first amplifier;

producing an amplified sinusoidal output from the first amplifier in response to the sinusoidal input waveform being applied as an input signal to the first amplifier;

coupling a portion of the amplified sinusoidal output to the resonant network through a load resistor;

supplying a single supply voltage to the second amplifier;

converting the amplified sinusoidal signal to a continuous pulse output of the second amplifier, said a supply voltage level greater than the voltage level applied to the first amplifier; and disabling the continuous pulse output in response to an input applied to the second amplifier.

8. The method of claim 7 further comprising the steps of disabling the continuous pulse output in response to an input applied to the second amplifier.

9. A low power clock oscillator circuit for reducing circuit power consumption comprising;

a resonant network configured as a Colpitts oscillator for providing an input waveform of a specified frequency to the oscillator circuit;

a first amplifier including an input coupled to the resonant network and an output coupled through a load resistor to the resonant network for producing a sinusoidal output having an oscillating frequency substantially equal to the input waveform frequency, said first amplifier having a supply terminal for receiving a supply voltage; and a bias resistor coupled between the first amplifier input and the first amplifier output for a second amplifier having a signal input and an enable input, said signal input being connected to the output of the first amplifier for converting the first amplifier sinusoidal output to a continuous pulse output, said enable input for disabling the continuous pulse output of said buffer amplifier thereby reducing power consumption of the oscillator circuit, said second amplifier including a supply terminal for receiving a supply voltage, wherein the second amplifier supply voltage is greater than the supply voltage of the first amplifier;

whereby powering the first amplifier from the lower supply voltage causes a reduction in supply current thereby reducing the power consumption of the clock oscillator circuit.

* * * * *